(12) United States Patent
Xu et al.

(10) Patent No.: US 11,742,805 B2
(45) Date of Patent: Aug. 29, 2023

(54) MULTIPLE OUTPUT LOW NOISE AMPLIFIER CIRCUIT, CHIP, AND ELECTRONIC DEVICE

(71) Applicant: Montage LZ Technologies (Shanghai) Co., Ltd., Shanghai (CN)

(72) Inventors: Jun Xu, Shanghai (CN); Shunfang Wu, Shanghai (CN); Shawn Si, Shanghai (CN)

(73) Assignee: Montage LZ Technologies (Shanghai) Co., Ltd., Shanghai (CN)

( * ) Notice: Subject to any disclaimer, the term of this patent is extended or adjusted under 35 U.S.C. 154(b) by 328 days.

(21) Appl. No.: 17/213,265

(22) Filed: Mar. 26, 2021

(65) Prior Publication Data
US 2022/0209724 A1    Jun. 30, 2022

(30) Foreign Application Priority Data
Dec. 29, 2020  (CN) .......................... 2020115895096

(51) Int. Cl.
*H03F 3/04*   (2006.01)
*H03F 3/193*  (2006.01)

(52) U.S. Cl.
CPC ....... *H03F 3/193* (2013.01); *H03F 2200/294* (2013.01); *H03F 2200/451* (2013.01)

(58) Field of Classification Search
CPC ....................................................... H03F 3/04
USPC ................................... 330/288; 323/315, 316
See application file for complete search history.

(56) References Cited

U.S. PATENT DOCUMENTS

| 6,359,511 B1 * | 3/2002 | Phanse | H03F 3/345 330/257 |
| 7,142,574 B2 * | 11/2006 | Asuri | H01S 5/06832 372/38.1 |
| 9,544,507 B2 * | 1/2017 | Serrano Gotarredona | H04N 25/772 |

* cited by examiner

*Primary Examiner* — Henry Choe

(57) ABSTRACT

The present disclosure provides a multiple output low noise amplifier circuit, chip and electronic device. The multiple output low noise amplifier circuit includes: a first processing module for amplifying an input voltage signal and converting it into at least two first current signals; a second processing module for impedance matching at the input terminal of the low noise amplifier circuit, and for amplifying the input voltage signal and converting it into at least two second current signals; a voltage output module, connected to the first processing module and the second processing module, for combining the first current signals and the second current signals and converting them into output voltage signals. The low noise amplifier circuit can convert a single input voltage signal to at least two output voltage signals, and is applicable in RF front ends with multiple output terminals.

9 Claims, 8 Drawing Sheets

MULTIPLE OUTPUT LOW NOISE AMPLIFIER CIRCUIT, CHIP, AND ELECTRONIC DEVICE

CROSS REFERENCE TO RELATED APPLICATION

The present application claims the benefit of priority to Chinese Patent Application No. CN 2020115895096, entitled "Low Noise Amplifier Circuit, Chip, and Electronic Device", filed on Dec. 29, 2020, the disclosure of which is incorporated herein by reference in its entirety.

TECHNICAL FIELD

This disclosure belongs to the field of communication technology, generally relates to a low noise amplifier circuit, in particular, to a low noise amplifier circuit, chip, and electronic device suitable for single-input and multi-output.

BACKGROUND

RF front ends are increasingly being designed with multiple output terminals so that signals on multiple frequency channels can be received simultaneously. For example, Set-top boxes (STBs) are being designed with multiple tuners to receive more than one frequency channels at a time. The capability of receiving two or more channels at once becomes more and more attractive since it enables useful features of picture-in-picture (PIP), personal video recording (PVR) and fast switching of programs. However, traditional RF front ends usually have only one output port, they are suitable for signal reception on a single frequency channel, and low-noise amplifier circuits used inside them are also designed for a single-output RF front end, and therefore the traditional RF front ends are difficult to be applied to multiple-output scenarios. Therefore, how to design a low-noise amplifier circuit suitable for scenarios with multiple output terminals has become a challenge.

SUMMARY

The present disclosure provides a low noise amplifier circuit, which includes one input terminal and at least two output terminals, amplifies an input voltage signal input from the input terminal, and converts the input voltage signal into at least two output voltage signals. Each output voltage signal is output through a corresponding output terminal. The low noise amplifier circuit also includes: a first processing module, the first processing module amplifies the input voltage signal input from the input terminal and converts the input voltage signal into at least two first current signals; a second processing module, the second processing module is used to achieve impedance matching at the input terminal of the low noise amplifier circuit and amplify the input voltage signal input from the input terminal and convert it into at least two second current signals, the number of the second current signals is equal to the number of the first current signals; and a voltage output module, the voltage output module is connected to the first processing module and the second processing module, combines the first current signal and the corresponding second current signal, and converts the combined current signal into the output voltage signal, the number of the output voltage signals is the same as the number of the first current signals.

In an embodiment, the first processing module includes: a first amplifier, which amplifies the input voltage signal input from the input terminal to obtain a first voltage signal; at least two first transconductors, the at least two first transconductors are connected to the first amplifier and convert the first voltage signal into the at least two first current signals.

In an embodiment, the first amplifier includes: a third transconductor, the third transconductor converts the input voltage signal input from the input terminal into a third current signal; and a first MOSFET, the gate and drain of the first MOSFET are connected, the gate of the first MOSFET is connected to each of the first transconductors to form at least two current mirrors, and the drain of the first MOSFET is connected to the third transconductor, the first MOSFET generates the first voltage signal at its gate based on the third current signal.

In an embodiment, the second processing module includes: a matching amplifying circuit, the matching amplifying circuit achieves impedance matching at the input terminal of the low noise amplifier circuit, amplifies the input voltage signal input from the input terminal to obtain a second voltage signal, and converts the second voltage signal into a feedback signal and feed it back to the input terminal; and at least two second transconductors are connected to the matching amplifying circuit, the second transconductors convert the second voltage signal into the at least two second current signals.

In an embodiment, the matching amplifying circuit includes: a second amplifier, the second amplifier amplifies the input voltage signal input from the input terminal to obtain the second voltage signal; and a feedback circuit, the feedback circuit is connected to the second amplifier and the input terminal, and converts the second voltage signal into the feedback signal and feed it back to the input terminal.

In an embodiment, the voltage output module includes: at least two current combining units, respectively connected to the first processing module and the second processing module, the current combining unit combines the first current signal and the corresponding second current signal to obtain a fourth current signal; the number of the fourth current signals is the same as the number of the first current signals; and at least two current-voltage conversion units, respectively connected to a corresponding current combining unit, the at least two current-voltage conversion units convert the fourth current signal into the output voltage signal.

In an embodiment, the first current signal and the second current signal are differential current signals. In an embodiment, the first current signal and the second current signal are single-ended current signals.

The present disclosure also provides a chip, the chip includes a low noise amplifier circuit disclosed herein.

The present disclosure also provides an electronic device, the electronic device includes a low noise amplifier circuit disclosed herein.

DETAILED DESCRIPTION

Figure 1:
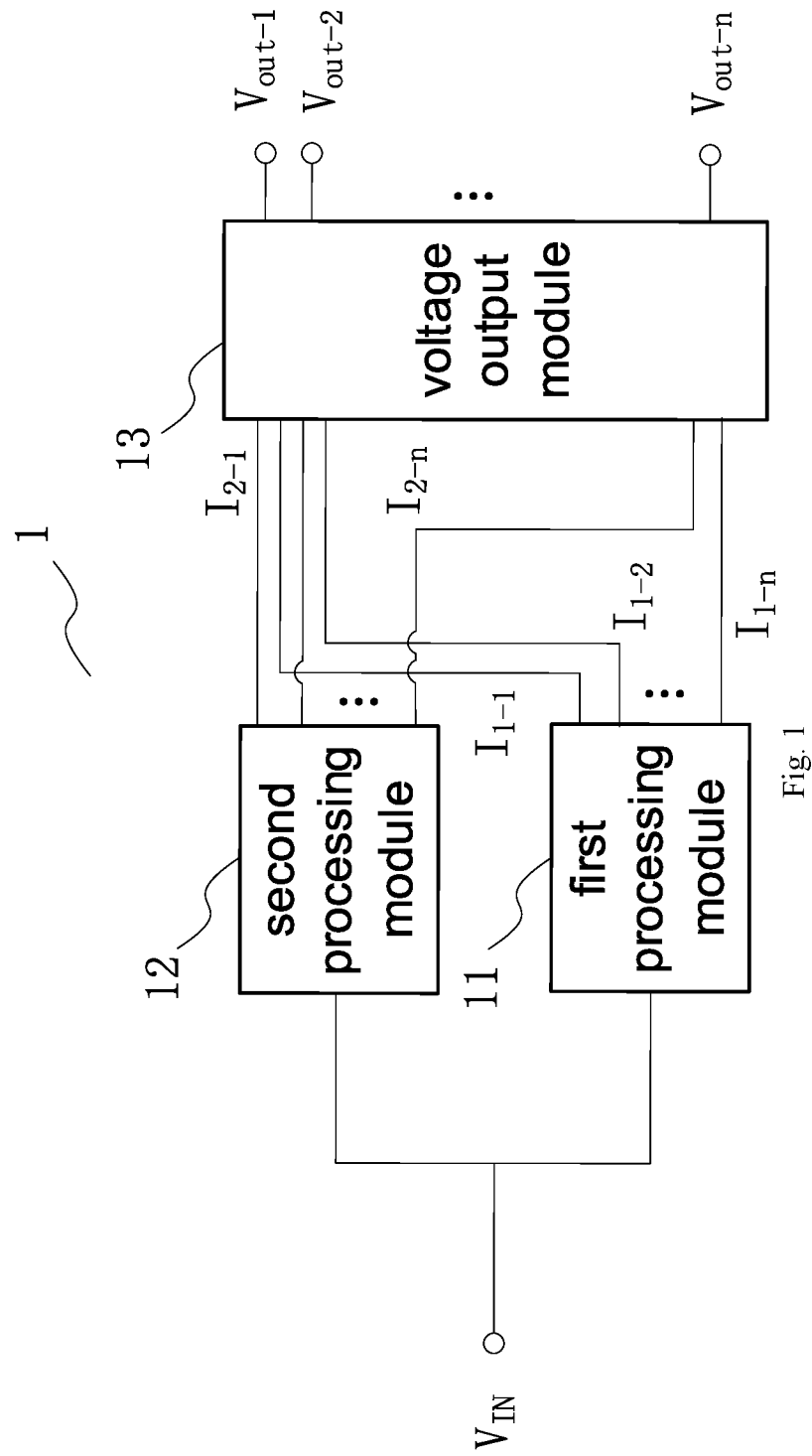
FIG. 1 is a schematic diagram showing a low noise amplifier circuit according to a first embodiment of the present disclosure.

One or more specific embodiments of the present disclosure will be described below. These described embodiments are only examples of the presently disclosed techniques, and are not intended to limit aspects of the presently disclosed disclosure. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In addition, herein, terms such as "first", "second", etc. are only used to distinguish one entity or operation from another entity or operation, and do not necessarily require these entities or operations be in a certain order.

In order to receive signals on multiple channels at the same time, existing receiver systems usually adopt passive splitters, multiple single-input single-output (SISO) low-noise amplifiers, current splitting common-source LNA, or voltage splitting topology. But these methods have their limitations when receiving signals at multiple channels at a time.

Although the passive splitters have good linearity, they will inevitably introduce signal loss, which will reduce the sensitivity of the entire receiver system. In addition, a passive splitter is usually a discrete component at an RF input, and it will increase the BOM (Bill of Material) cost. A passive splitter can also be realized on chip, but it will increase the die area and therefore the chip cost.

The structure in which multiple SISO low-noise amplifiers are directly connected to the same RF input terminal to generate multiple outputs has the problem of interaction among different receiving paths, especially the problems of impedance matching and noise performance.

Current splitting common source low-noise amplifiers are widely used in multiple output RF front ends. However, inductive degeneration is normally needed for impedance matching, which limits the application of this solution in broadband scenarios. In addition, current splitting introduces penalties on noise performance.

The voltage splitting topology is basically composed of cascaded voltage amplifications stages. The first stage is a low-noise amplifier at a RF input terminal, and the second stage is multiple voltage amplifiers or transconductors. Although this structure can achieve single-input and multiple-output, the cascaded voltage amplification stages will limit the linearity of the circuit, resulting in signal distortion, and the first stage low-noise amplifier will still face problems in terms of noise figure, impedance matching, and linearity.

In light of the above problems, the present disclosure provides a low noise amplifier circuit, which can convert a single input voltage signal to at least two output voltage signals. Therefore, the low noise amplifier circuit can be applied to scenarios where the RF front end has multiple output terminals.

Referring to FIG. 1, in an embodiment, the low noise amplifier circuit 1 has a single input terminal and at least two output terminals, and is used for amplifying and converting an input voltage signal $V_{IN}$ input from the input terminal into at least two output voltage signals, each of which is output through the output terminal. The low noise amplifier circuit 1 includes a first processing module 11, a second processing module 12, and a voltage output module 13.

The first processing module 11 is used to amplify the input voltage signal input from the input terminal $V_{IN}$ and convert it into at least two first current signals, such as $I_{1-1}, I_{1-2} \ldots I_{1-n}$, where n is an integer greater than or equal to 2.

The second processing module 12 is used to achieve impedance matching at the input terminal of the low noise amplifier circuit 1, and is used to amplify the input voltage signal $V_{IN}$ input from the input terminal and convert it into at least two second current signals, such as $I_{2-1}, I_{2-2} \ldots I_{2-n}$. The number of the second current signals is the same as the number of the first current signals, and the second current signals correspond to the first current signals, respectively. In some embodiments, the second processing module 12 may achieve the impedance matching in the same manner as some existing low-noise amplifiers.

The voltage output module 13 is connected to the first processing module 11 and the second processing module 12, and is used to correspondingly combine the first current signals and the second current signals and then convert the combined current signal into an output voltage signal. Specifically, the corresponding combination means that for any first current signal, the voltage output module 13 combines (for example, superimposes or adds) the first current signal and its corresponding second current signal into a current signal, and convert the current signal into an output voltage signal. For examples, please refer to FIG. 1 and FIG. 6. For the first current signal $I_{1-1}$, the corresponding second current signal is $I_{2-1}$. A current signal $I_{4-1}$ is obtained by combining $I_{1-1}$ and $I_{2-1}$. And an output voltage signal $V_{out-1}$ can be obtained after the current signal $I_{4-1}$ flows through a load circuit such as a resistor.

According to the above description, the low noise amplifier circuit 1 can amplify one input voltage signal input from its input terminal to obtain multiple output voltage signals, and thus can realize the conversion of a single-terminal input to a multi-terminal output, and is suitable for a RF front end with multiple output terminals.

Figure 2:
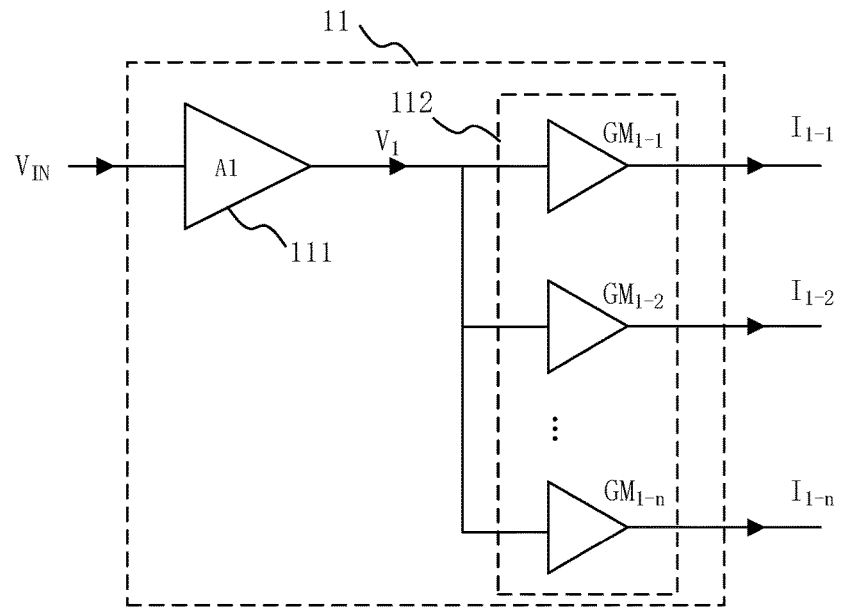
FIG. 2 is a schematic diagram showing a first processing module of a low noise amplifier circuit according to an embodiment of the present disclosure.

Referring to FIG. 2, in some embodiments, the first processing module 11 includes a first amplifier (A1) 111 and at least two first transconductors 112.

The first amplifier 111 amplifies the input voltage signal $V_{IN}$ input from the input terminal to obtain a first voltage signal $V_1$. In an embodiment, the first amplifier 111 is a low noise voltage amplifier.

The at least two first transconductors 112 is connected to the first amplifier 111, and is used to convert the first voltage signal into the at least two first current signals. Specifically, each of the first transconductors 112 is connected to an output terminal of the amplifier 111, and can convert the first voltage signal $V_1$ into a first current signal. For example, a first transconductor $GM_{1-1}$ can convert the first voltage signal $V_1$ into a first current signal $I_{1-1}$. The output of the first transconductors $GM_{1-1}$, $GM_{1-2}$, . . . , $GM_{1-n}$ is the output of the first processing module 11, where n is an integer greater than or equal to 2. The first transconductors may be realized with MOSFETs, but is not limited thereto, and it can be realized with any suitable devices.

Figure 3:
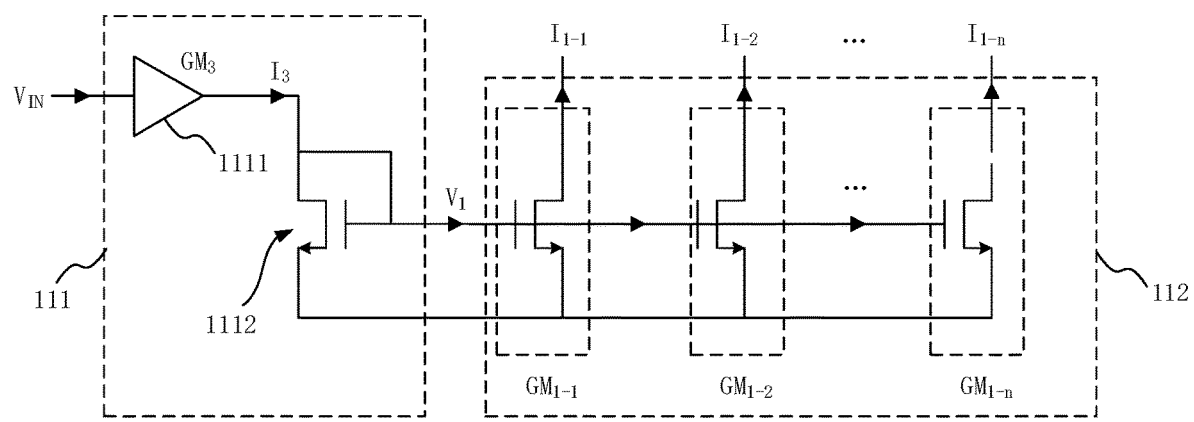
FIG. 3 is a schematic diagram showing a first processing module of a low noise amplifier circuit according to another embodiment of the present disclosure.

With reference to FIG. 3, in an embodiment, the first amplifier 111 includes a third transconductor 1111 and a first MOSFET 1112. The third transconductor 1111 is used to convert the input voltage signal $V_{IN}$ input from the input terminal into a third current signal $I_3$. The gate and drain of the first MOSFET 1112 are connected to form a diode, and the gate of the first MOSFET 1112 is connected to each of the first transconductors to form at least two corresponding current mirrors. The first MOSFET 1112, based on the third current signal $I_3$, forms the first voltage signal $V_1$ at the gate of the first MOSFET 1112. The third current signal $I_3$ forms the at least two first current signals after passing through each of the current mirrors. For example, the first MOSFET 1112 and the first transconductors $GM_{1-1}$ constitute a first current mirror, and the third current $I_3$ forms a first current signal $I_{1-1}$ after passing through the first current mirror; the first MOSFET 1112 and the first transconductors $GM_{1-2}$ constitute a second current mirror, and the third current $I_3$ forms another first current signal $I_{1-2}$ after passing through the second current mirror.

According to the above description, the first MOSFET 1112 in some embodiments is connected to each of the first transconductors and constitutes at least two corresponding current mirrors. The third current signal $I_3$ output by the third transconductor $GM_3$ is converted into a voltage $V_1$ on the diode-connected MOSFET inside the current mirror. Then the voltage $V_1$ is converted respectively by the first transconductor in each current mirror to the at least two first current signals as an output. Although the output of the first amplifier 111 in this embodiment is a voltage signal, the existence of a current mirror can ensure that the linearity of the signal will not be degraded, and thus can ensure that the first processing module has good linearity.

In above embodiments, the first amplifier with a single-ended signal is provided. In practical application, the circuit structure of the first amplifier can be adjusted to process differential signals.

Figure 4:
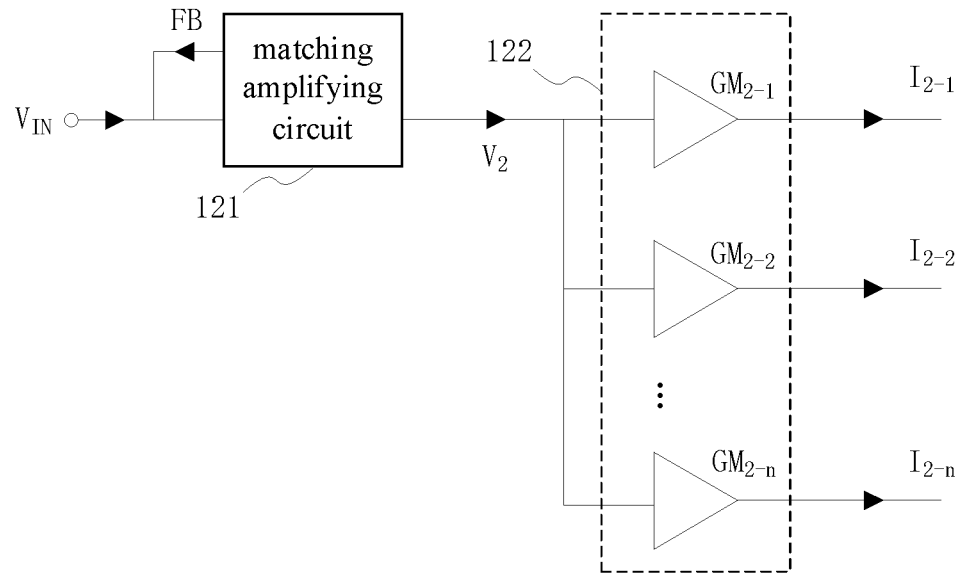
FIG. 4 is a schematic diagram showing a second processing module of a low noise amplifier circuit according to an embodiment of the present disclosure.

Referring to FIG. 4, in an embodiment, the second processing module 12 includes a matching amplifying circuit 121 and at least two second transconductors 122. Among them, the matching amplifying circuit 121 is used to achieve impedance matching at the input terminal of the low noise amplifier circuit 1, and amplify the input voltage signal input from the input terminal to obtain a second voltage signal $V_2$ The matching amplifying circuit 121 also converts the second voltage signal $V_2$ into a feedback signal FB and feeds it back to the input terminal. Input terminals of at least two second transconductors 122 are connected to output terminal of the matching amplifying circuit 121. The second transconductors 122 converts the second voltage signal $V_2$ into the at least two second current signals. Specifically, each of the second transconductors 122 converts the second voltage signal $V_2$ to a second current signal. For example, the second transconductor $GM_{2-1}$ can convert the second voltage signal $V_2$ into a second current signal $I_{2-1}$. The output of the second transconductors $GM_{2-1}$, $GM_{2-2}$, . . . , $GM_{2-n}$ is the output of the second processing module 12, where n is an integer greater than or equal to 2. In an embodiment, the second transconductors may be realized with MOSFETs.

In an embodiment, as described above, the matching amplifying circuit 121 can amplify the input voltage signal input from the input terminal. Therefore, the matching amplifying circuit 121 can suppress the noise of the second transconductors, and the noise of the second transconductors will not be a major noise contribution in the low noise amplifier circuit, thereby allowing the second transconductors to have higher linearity.

Figure 5:
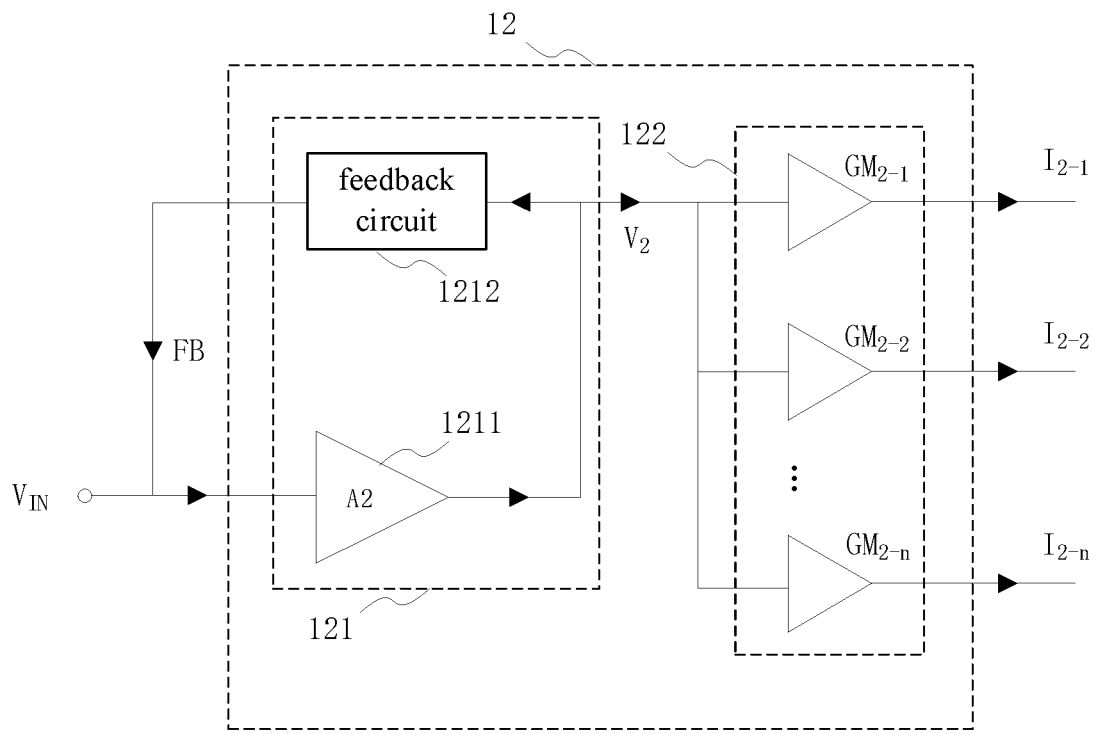
FIG. 5 is a schematic diagram showing a second processing module of a low noise amplifier circuit according to another embodiment of the present disclosure.

Referring to FIG. 5, in an embodiment, the matching amplifying circuit 121 includes a second amplifier (A2) 1211 and a feedback circuit 1212. Among them, the second amplifier 1211 amplifies the input voltage signal $V_{IN}$ input from the input terminal to obtain the second voltage signal $V_2$; the input terminal of the feedback circuit 1212 is connected to the output terminal of the second amplifier 1211, the output terminal of the feedback circuit 1212 is connected to the input terminal, and the feedback circuit 1212 converts the second voltage signal into the feedback signal FB and feeds it back to the input terminal.

In practical applications, the matching amplifying circuit 121 may generate noise, and the second voltage signal $V_2$ may contains all or part of the noise voltage generated by the matching amplifying circuit 121. On the one hand, the noise voltage is transferred to the input terminal after passing through the feedback circuit, and forms a first noise current after passing through the first transconductor of the first processing module. On the other hand, the noise voltage forms a second noise current after passing through the second transconductor of the second processing module. In particular, when the low noise amplifier circuit 1 is implemented using the circuit shown in FIG. 6, the phases of the first noise current and the second noise current are opposite.

Figure 6:
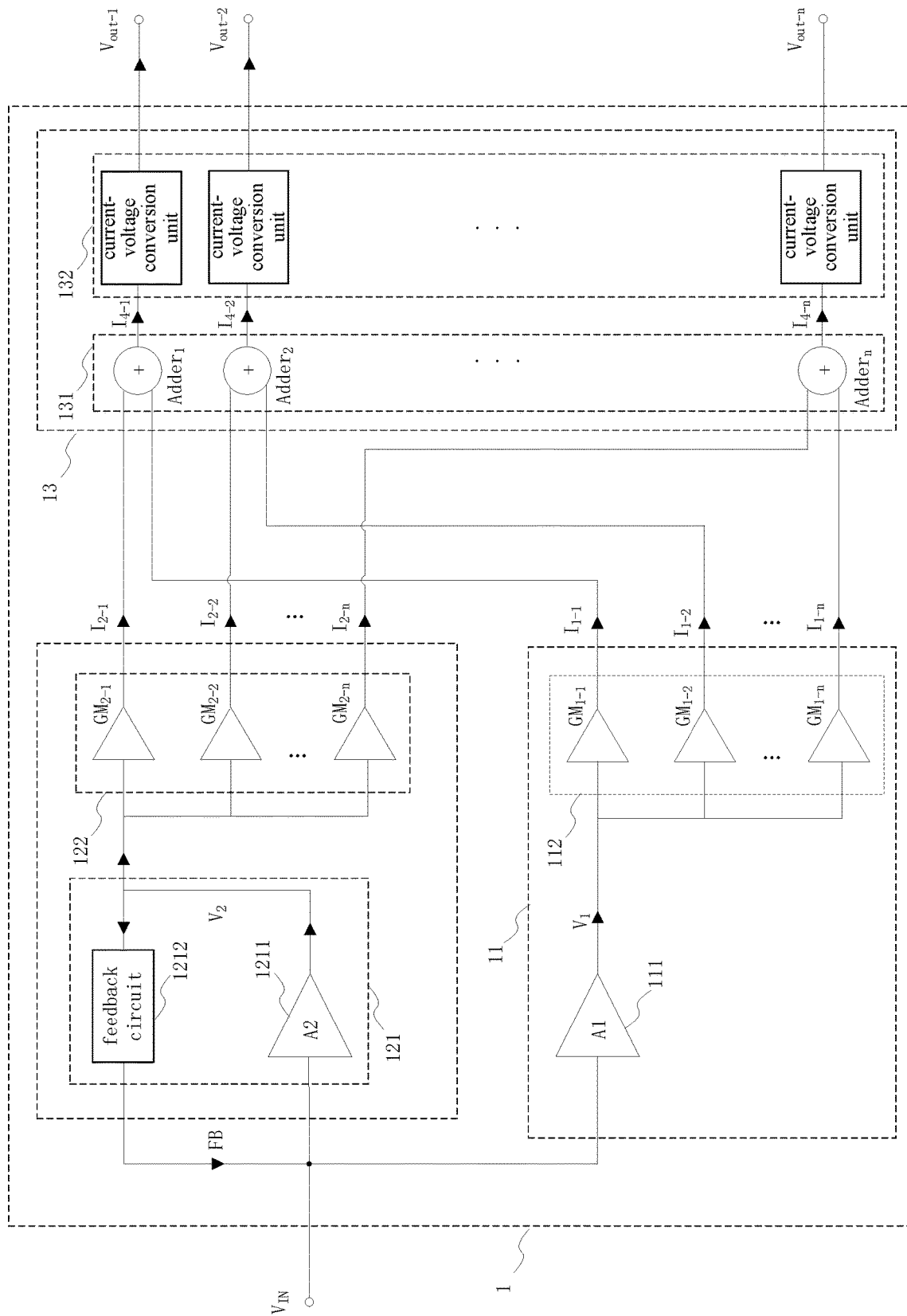
FIG. 6 is a schematic diagram showing a low noise amplifier circuit according to a second embodiment of the present disclosure.

It should be noted that FIG. 6 shows only an example of the low noise amplifier circuit. When the low noise amplifier circuit is implemented in other ways, the phases of the first noise current and/or the second noise current can be adjusted by using components such as an inverting amplifier in the circuit to ensure the phase of first noise current is opposite to the phase of the second noise current.

Still referring to FIG. 6, in an embodiment, the voltage output module 13 includes at least two current combining units 131 and at least two current-voltage conversion units 132, each of the current-voltage conversion units 132 are connected to its corresponding current combining unit 131, and the number of the current-voltage conversion units 132 is the same as the number of the current combining units 131.

The at least two current combining units 131 are respectively connected to the first processing module 11 and the second processing module 12, so that each of the current combining units 131 corresponds to one of the first current signals output by the first processing module 11 and each of the current combining units 131 corresponds to one of the second current signal output by the second processing module 12. Each of the current combining units 131 is used to combine its corresponding first current signal and its corresponding second current signal to obtain a fourth current signal. For example, for a current combining unit $Adder_1$, its corresponding first current signal is $I_{1-1}$, and its corresponding second current signal is $I_{2-1}$, and the current combining unit $Adder_1$ can combine the first current signal $I_{1-1}$ and the second current signal $I_{2-1}$ to obtain a corresponding fourth current signal $I_{4-1}$.

In particular, when the first noise current and the second noise current are present in the low noise amplifier circuit, the current combining units 131 are also used to combine the first noise current and the second noise current. Since the phases of the first noise current and the second noise current are opposite, the first noise current and the second noise current can be partially cancelled or completely cancelled after the two are combined, thereby reducing or even eliminating the noise current in the low noise amplifier circuit.

Each of the current-voltage conversion units 132 is respectively connected to a corresponding current combining unit; the fourth current signals flow through the current-voltage conversion units 132 to form the output voltage signals. Specifically, each of the current-to-voltage conversion units is used to convert a fourth current signal and obtain an output voltage signal; the output voltage signals of all current-voltage converting units 132 are the output voltage signals of the low noise amplifier circuit.

According to the above description, the low noise amplifier circuit in an embodiment can combine the first noise current and the second noise current through the current combining units, so as to realize the complete or partial cancellation of the first noise current and the second noise current, and help to reduce the noise generated by the second amplifier A2, which provides sufficient freedom for designing the second amplifier A2 and ensures that the second amplifier A2 can be designed with better performance, such as higher linearity and lower power consumption.

In an embodiment, the first current signals and the second current signals are differential current signals, or single-ended current signals. When the two are single-ended current signals, an embodiment of the low noise amplifier circuit is implemented as shown in FIG. 6.

Figure 7A:
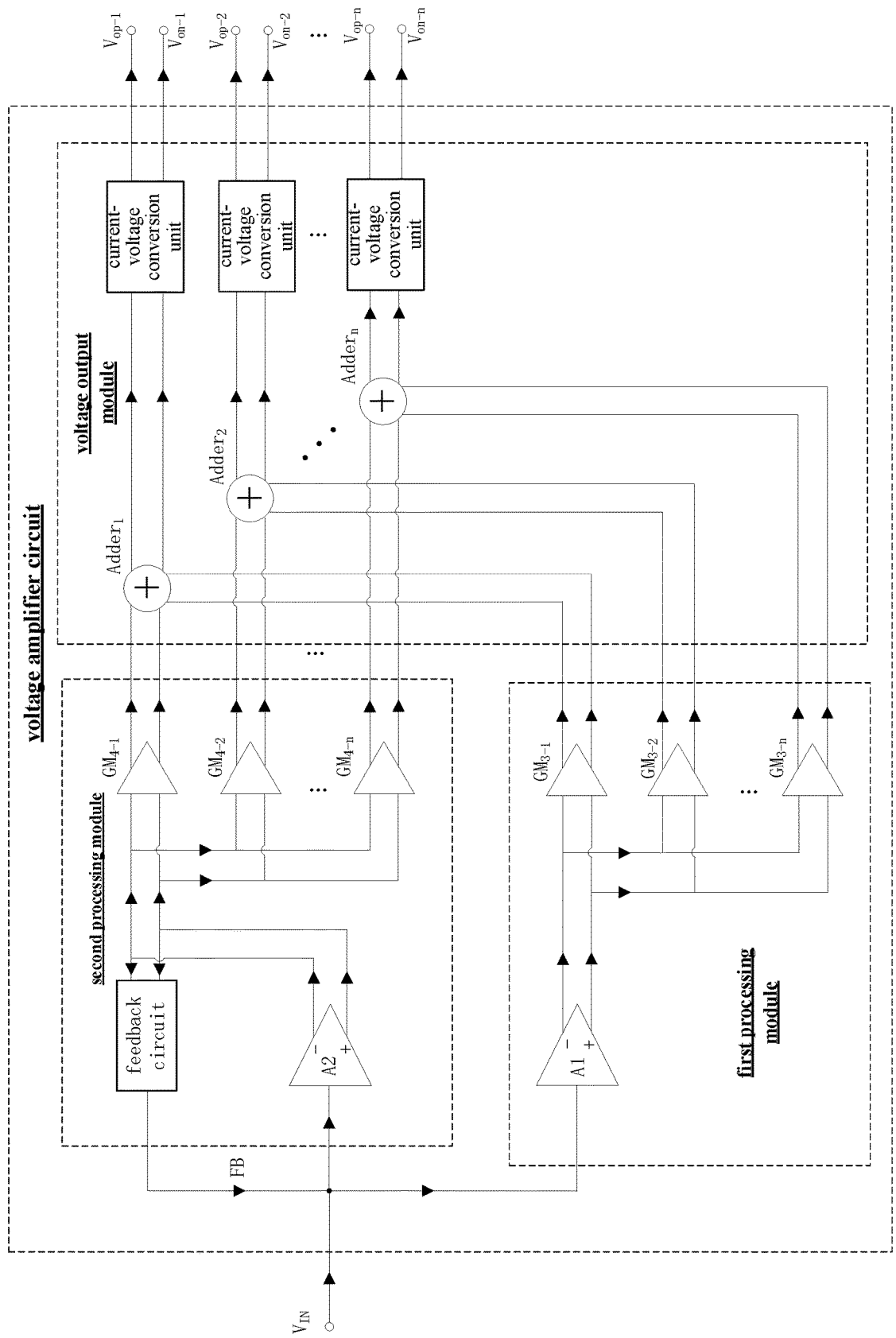
FIG. 7A is a schematic diagram showing a low noise amplifier circuit according to a third embodiment of the present disclosure.

When the first current signals and the second current signals are differential current signals, an embodiment of the low noise amplifier circuit is shown in FIG. 7A, where the first amplifier A1 and the second amplifier A2 are implemented in a single-ended to differential configuration. Correspondingly, the first transconductor, the second transconductor, the feedback circuit, the current combining units and the current-voltage conversion units used in the circuit also adopt a differential configuration to process the differential signal(s) in the circuit. In the low noise amplifier circuit, the noise from the second amplifier A2 is partially or completely cancelled in a differential way when the first current signals and the second current signals are differential current signals. The circuit structure is implemented in a differential form, which ensures that the low noise amplifier circuit has a good power supply rejection, common mode rejection, and second-order linearity.

Figure 7B:
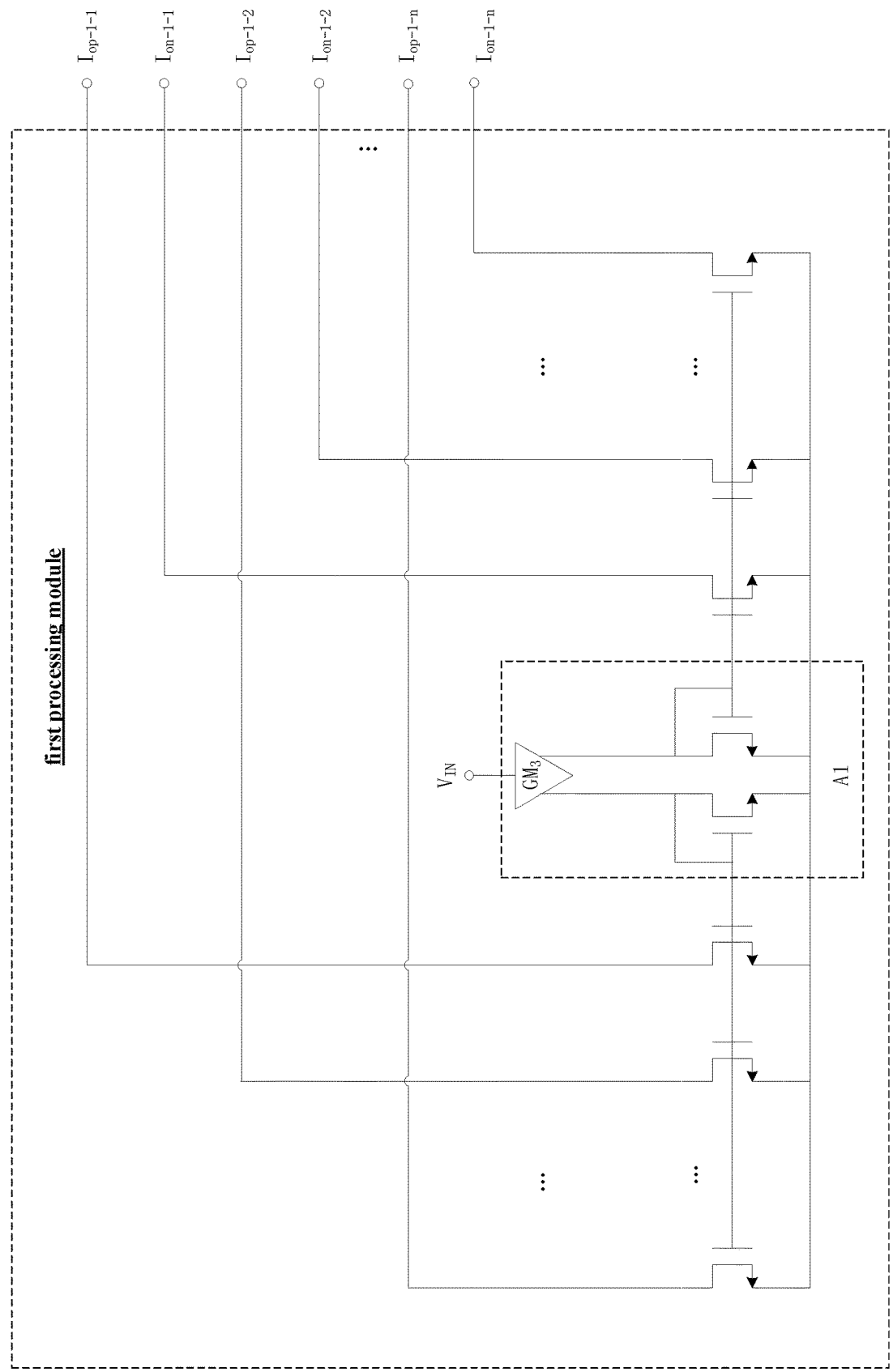
FIG. 7B is a schematic diagram showing a first processing module of a low noise amplifier circuit according to an embodiment of the present disclosure.
Figure 7C:
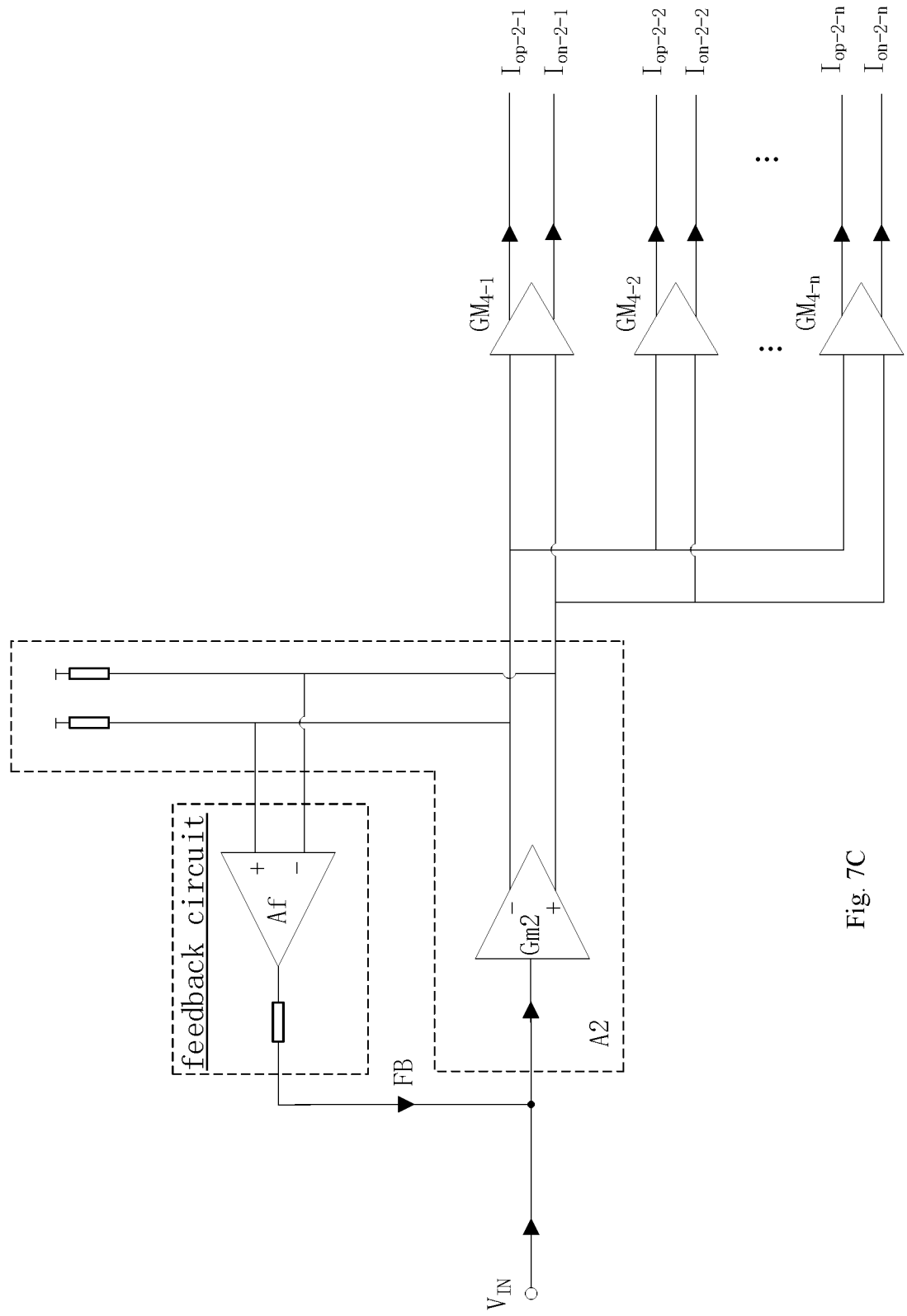
FIG. 7C is a schematic diagram showing a second processing module of a low noise amplifier circuit according to an embodiment of the present disclosure.

Specifically, when the first current signals and the second current signals are differential current signals, an embodiment of the first processing module is shown in FIG. 7B. The third transconductor $GM_3$ has a single-ended input and a differential output, and its output current is converted into the voltage on the diode-connected MOSFET, and then converted into current by the current mirror. Due to the nature of the current mirror, although the output of the first amplifier A1 is a voltage signal, the linearity of the signal in the first processing module will not be degraded. An embodiment of the second processing module is shown in FIG. 7C, where the feedback circuit adopts a differential input and a single-ended output.

According to the above description, the low noise amplifier circuit in an embodiment can realize single-ended input and differential output. In an embodiment, the single-end input to differential output conversion in signal reception is usually implemented by a BALUN. In this embodiment, the low noise amplifier circuit allows the first amplifier and the second amplifier to adopt a single-ended to differential configuration, so as to realize the conversion of single-end signal to differential signal in the RF front end. Eliminating the usage of BALUNs helps to reduce costs.

Figure 8:
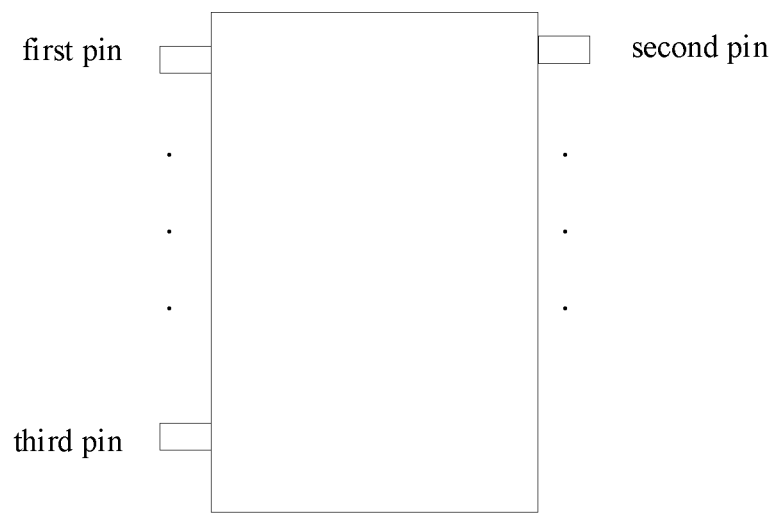
FIG. 8 is a schematic diagram showing a chip according to an embodiment of the present disclosure.

Based on the above description of the low noise amplifier circuit, the present disclosure also provides a chip. Referring to FIG. 8, in an embodiment, the chip includes at least part of the low noise amplifier circuit disclosed herein. For example, the chip may include the entire low noise amplifier circuit, or may only include the first processing module and/or the second processing module in the low noise amplifier circuit. The chip may be a saleable active device that is a packaged voltage discharge circuit manufactured on a wafer using semiconductor technology; or a saleable active device that is a low noise amplifier circuit packaged using PCB packaging technology.

Based on the above description of the low noise amplifier circuit, the present disclosure also provides an electronic device, and the electronic device includes the low noise amplifier circuit disclosed herein. The electronic device includes but is not limited to a set-top box.

The input voltage $V_{IN}$ in the low noise amplifier circuit disclosed herein can be effectively amplified by the first processing module and the second processing module, and their output currents are added at each current combining unit. The first processing module may include the current mirror formed by the third transconductor and the first MOSFET. The existence of the current mirror ensures that the first processing module has higher linearity. In the second processing module, the second amplifier A2 suppresses the noise in the second transconductor. Therefore, the noise in the second transconductor will not become the main noise contribution in the circuit, and the second transconductor can have higher linearity; the noise of the second amplifier A2 is the main noise source that is introduced due to impedance matching requirement. The noise is transferred to each current combining unit through the first processing module and the second processing module. Since the first noise current from the first processing module and the second noise current from the second processing module have opposite phases, the current combining units can reduce or even eliminate the noise currents, which provides sufficient freedom to design the second amplifier A2. So the second amplifier A2 can be designed to have higher linearity and lower power consumption. The low noise amplifier circuit of the present disclosure is a multi-output broadband low noise amplifier with noise cancellation which is especially suitable for broadband applications.

In addition, the low noise amplifier circuit disclosed herein can be configured to achieve single-ended input and differential output, thereby reducing the use of BALUNs, which is conducive to reducing cost.

While particular elements, embodiments, and applications of the present disclosure have been shown and described, it is understood that the disclosure is not limited thereto because modifications may be made by those skilled in the art, particularly in light of the foregoing teaching. It is therefore contemplated by the appended claims to cover such modifications and incorporate those features which come within the spirit and scope of the disclosure.

What is claimed is:

1. A low noise amplifier circuit, comprising one input terminal and at least two output terminals, amplifying an input voltage signal and converting the input voltage signal into at least two output voltage signals, wherein each output voltage signal is output through a corresponding output terminal, the low noise amplifier circuit comprises:
   a first processing module, the first processing module amplifies the input voltage signal and converts the input voltage signal into at least two first current signals;
   a second processing module, the second processing module is used to achieve impedance matching at the input terminal of the low noise amplifier circuit and amplify the input voltage signal and convert it into at least two second current signals, the number of the second current signals is equal to the number of the first current signals; and
   a voltage output module, the voltage output module is connected to the first processing module and the second processing module, combines the first current signal and the corresponding second current signal, and converts the combined current signal into the output voltage signal, the number of the output voltage signals is the same as the number of the first current signals.

2. The low noise amplifier circuit according to claim 1, wherein the first processing module comprises:
   a first amplifier, which amplifies the input voltage signal to obtain a first voltage signal; and
   at least two first transconductors, the at least two first transconductors are connected to the first amplifier and convert the first voltage signal into the at least two first current signals.

3. The low noise amplifier circuit according to claim 2, wherein the first amplifier comprises:
   a third transconductor, the third transconductor converts the input voltage signal into a third current signal; and
   a first MOSFET,
      a gate and a drain of the first MOSFET are connected, the gate of the first MOSFET is connected to each of the first transconductors to form at least two current mirrors, and a drain of the first MOSFET is connected to the third transconductor,
      the first MOSFET generates the first voltage signal at the gate of the first MOSFET based on the third current signal.

4. The low noise amplifier circuit according to claim 1, wherein the second processing module comprises:
   a matching amplifying circuit, the matching amplifying circuit achieves impedance matching at the input terminal of the low noise amplifier circuit, amplifies the input voltage signal to obtain a second voltage signal, and converts the second voltage signal into a feedback signal and feeds it back to the input terminal; and
   at least two second transconductors, connected to the matching amplifying circuit, the second transconductor converts the second voltage signal into the at least two second current signals.

5. The low noise amplifier circuit according to claim 4, wherein the matching amplifying circuit comprises:
   a second amplifier, the second amplifier amplifies the input voltage signal to obtain the second voltage signal; and
   a feedback circuit, the feedback circuit is connected to the second amplifier and the input terminal, and converts the second voltage signal into the feedback signal and feeds it back to the input terminal.

6. The low noise amplifier circuit according to claim 1, wherein the voltage output module comprises:
   at least two current combining units, respectively connected to the first processing module and the second processing module, the current combining unit combines the first current signal and the corresponding second current signal to obtain a fourth current signal; the number of the fourth current signals is the same as the number of the first current signals; and
   at least two current-voltage conversion units, respectively connected to a corresponding current combining unit, the at least two current-voltage conversion units convert the fourth current signal into the output voltage signal.

7. The low noise amplifier circuit according to claim 1, wherein
   the first current signal and the second current signal are differential current signals; or
   the first current signal and the second current signal are single-ended current signals.

8. A chip, wherein the chip comprises a low noise amplifier circuit, the low noise amplifier circuit comprises one input terminal and at least two output terminals and amplifies an input voltage signal input from the input terminal and converts the input voltage signal into at least two output voltage signals, each output voltage signal is output through a corresponding output terminal, the low noise amplifier circuit comprises:
   a first processing module, the first processing module amplifies the input voltage signal and converts the input voltage signal into at least two first current signals;
   a second processing module, the second processing module is used to achieve impedance matching at the input terminal of the low noise amplifier circuit and amplify the input voltage signal input from the input terminal and convert it into at least two second current signals, the number of the second current signals is equal to the number of the first current signals; and
   a voltage output module, the voltage output module is connected to the first processing module and the second processing module, combines the first current signal and the corresponding second current signal, and converts the combined current signal into the output voltage signal, the number of the output voltage signals is the same as the number of the first current signals.

9. An electronic device, wherein the electronic device comprises a low noise amplifier circuit, the low noise amplifier circuit comprises one input terminal and at least two output terminals and amplifies an input voltage signal input from the input terminal and converts the input voltage signal into at least two output voltage signals, each output voltage signal is output through a corresponding output terminal, the low noise amplifier circuit comprises:
   a first processing module, the first processing module amplifies the input voltage signal input from the input terminal and converts the input voltage signal into at least two first current signals;
   a second processing module, the second processing module is used to achieve impedance matching at the input terminal of the low noise amplifier circuit and amplify the input voltage signal input from the input terminal and convert it into at least two second current signals, the number of the second current signals is equal to the number of the first current signals; and a voltage output module, the voltage output module is connected to the first processing module and the second processing module, combines the first current signal and the corresponding second current signal, and converts the combined signal into the output voltage signal, the number of the output voltage signals is the same as the number of the first current signals.

* * * * *